United States Patent
Tamma et al.

(10) Patent No.: US 11,757,066 B2
(45) Date of Patent: Sep. 12, 2023

(54) LED EMITTERS WITH INTEGRATED NANO-PHOTONIC STRUCTURES TO ENHANCE EQE

(71) Applicant: LUMILEDS LLC, San Jose, CA (US)

(72) Inventors: Venkata Ananth Tamma, San Jose, CA (US); Toni Lopez, Aachen (DE)

(73) Assignee: Lumileds LLC, San Jose, CA (US)

( * ) Notice: Subject to any disclaimer, the term of this patent is extended or adjusted under 35 U.S.C. 154(b) by 268 days.

(21) Appl. No.: 17/331,338

(22) Filed: May 26, 2021

(65) Prior Publication Data

US 2021/0296539 A1    Sep. 23, 2021

Related U.S. Application Data

(63) Continuation of application No. 16/160,738, filed on Oct. 15, 2018, now Pat. No. 11,024,775.
(Continued)

(30) Foreign Application Priority Data

Feb. 27, 2018 (EP) ..................................... 18158917

(51) Int. Cl.
*H01L 33/46* (2010.01)
*H01L 33/06* (2010.01)
(Continued)

(52) U.S. Cl.
CPC .............. *H01L 33/46* (2013.01); *H01L 33/06* (2013.01); *H01L 33/10* (2013.01); *H01L 33/20* (2013.01);
(Continued)

(58) Field of Classification Search
CPC . H01L 33/46; H01L 33/10; H01L 2933/0083; H01L 33/58
See application file for complete search history.

(56) References Cited

U.S. PATENT DOCUMENTS 4,730,331 A    3/1988  Burnham et al.
7,672,548 B2   3/2010  Zoorb et al.
(Continued)

FOREIGN PATENT DOCUMENTS

CN    102034913 A    4/2011
CN    102290513 A    12/2011
(Continued)

OTHER PUBLICATIONS

Gu et al., "Light-emitting diodes enhanced by localized surface plasmon resonance", Nanoscale Research Letters, Springer, Mar. 8, 2011, vol. 6, 199.
(Continued)

*Primary Examiner* — Amar Movva

(57) ABSTRACT

A device, system and method for producing enhanced external quantum efficiency (EQE) LED emission are disclosed. The device, system and method include a patterned layer configured to transform surface modes into directional radiation, a semiconductor layer formed as a III/V direct bandgap semiconductor to produce radiation, and a metal back reflector layer configured to reflect incident radiation. The patterned layer may be one-dimensional, two-dimensional or three-dimensional. The patterned layer may be submerged within the semiconductor layer or within the dielectric layer. The semiconductor layer is p-type gallium nitride (GaN). The patterned layer may be a hyperbolic metamaterials (HMM) layer and may include Photonic Hypercrystal (PhHc), or may be a low or high refractive index material or may be a metal.

15 Claims, 12 Drawing Sheets

Related U.S. Application Data

(60) Provisional application No. 62/683,410, filed on Jun. 11, 2018, provisional application No. 62/573,383, filed on Oct. 17, 2017.

(51) Int. Cl.
*H01L 33/10* (2010.01)
*H01L 33/20* (2010.01)
*H01L 33/60* (2010.01)

(52) U.S. Cl.
CPC ...... *H01L 33/60* (2013.01); *H01L 2933/0083* (2013.01)

(56) References Cited

U.S. PATENT DOCUMENTS

| | | |
|---|---|---|
| 8,338,819 B2 | 12/2012 | Lu et al. |
| 8,476,088 B2 | 7/2013 | Lee et al. |
| 8,618,729 B2 | 12/2013 | Frischeisen et al. |
| 9,263,637 B2 | 2/2016 | Tan et al. |
| 9,537,116 B2 | 1/2017 | Lamansky et al. |
| 9,784,888 B2 | 10/2017 | Naik et al. |
| 9,865,768 B2 | 1/2018 | Liu et al. |
| 11,024,775 B2 | 6/2021 | Tamma et al. |
| 2005/0285128 A1 | 12/2005 | Scherer et al. |
| 2009/0114940 A1 | 5/2009 | Yang et al. |
| 2010/0127635 A1 | 5/2010 | Yao |
| 2010/0213485 A1 | 8/2010 | McKenzie et al. |
| 2010/0314606 A1 | 12/2010 | Yang et al. |
| 2011/0233514 A1 | 9/2011 | Lu et al. |
| 2012/0043571 A1 | 2/2012 | Chu et al. |
| 2016/0274301 A1 | 9/2016 | Mastro |
| 2017/0082785 A1 | 3/2017 | Verschuuren et al. |
| 2017/0179334 A1 | 6/2017 | Liu et al. |

FOREIGN PATENT DOCUMENTS

| | | |
|---|---|---|
| CN | 102969423 A | 3/2013 |
| CN | 103219442 A | 7/2013 |
| CN | 103840056 A | 6/2014 |
| CN | 104241492 A | 12/2014 |
| CN | 104813500 A | 7/2015 |
| CN | 105409015 A | 3/2016 |
| EP | 3149782 B1 | 9/2017 |
| JP | 2011159956 A | 8/2011 |
| JP | 2011216555 A | 10/2011 |
| JP | 2012516569 A | 7/2012 |
| JP | 2012528434 A | 11/2012 |
| KR | 20080076430 A | 8/2008 |
| KR | 100896594 B | 5/2009 |
| KR | 100896594 B1 | 5/2009 |
| TW | 200629598 A | 8/2006 |
| TW | 201101540 A | 1/2011 |
| TW | 201133937 A | 10/2011 |
| WO | 2012/098487 A1 | 7/2012 |
| WO | 2015/019220 A1 | 2/2015 |
| WO | 2015/019229 A1 | 2/2015 |
| WO | 2015/0192209 A1 | 2/2015 |
| WO | 2015/180970 A1 | 12/2015 |

OTHER PUBLICATIONS

Cho et al., "Enhanced optical output power of green light-emitting diodes by surface plasmon of gold nanoparticles", Applied Physics Letters, American Institute of Physics, Feb. 3, 2021, vol. 98, 051106.

Okamoto et al., "High-Efficiency InGaN/GaN Light Emitters Based on Nanophotonics and Plasmonics", IEEE Journal of Selected Topics in Quantum Electronics, IEEE, Jul. 28, 2009, vol. 15, pp. 1199-1209.

International Search Report and the Written Opinion from the EPO as the ISA,PCT/US2018/056024, dated Jan. 15, 2019, 19 pages.

Galfsky et al., "Photonic Hypercrystals," Proceedings of the National Academy of Sciences, 114 (20) 5125-5129 (May 2017).

Kock, et al., "Strongly directional emission from AlGaAs/GaAs light emitting diodes," Appl. Phys. Lett. 57, 2327 (1990).

Narimanov, "Photonic Hypercrystals," Phys. Rev. X4, 041014 (Oct. 27, 2014).

Lozano et al., "Taylor-made directional emission in nanoimprinted plasmonic-based light-emitting devices," Nanoscale, 6 pages. 9223-9 (2014).

Lozano et al., "Plasmonics for solid-state lighting: enhanced excitation and directional emission of highly efficient light sources," Light: Science & Applications, 2 pages e66 (2013).

Esfandyarpour et al., "Metamaterial mirrors in optoelectronic devices," Nature nanotechnology, 9(7) pp. 542-547 (2014).

Glab-Laboratory for Graphene, Other 2D Materials and Ordered Nanostructures-Center for Solid State Phyusics and New Materials, "Micromechanical Exfoliation," Available at: https://web.archive.org/web/20171003194042/http//www.graphene.ac.rs/exvoliation.html (Oct. 3, 2017).

Van Der Walls Epitaxy, "Layered transition metal dichalcogenides," Available at: https://web. archive.org/web/20160531133001/http://van-der-walls-epitaxyinfo/?attachment_id=317 (May 2016).

Amani et al., "Near-unity photoluminescence quantum yield in MoS2," Science, pp. 1065-1068, (2015).

Khurgin et al., "Electroluminescense efficiency enhancement using metal nanoparticles," Applied Physics Letters 93, 021120 (2008).

Lu et al., "Improved light emission of GaN-based light-emitting diodes by efficient localized surface plasmon coupling with silver nanoparticles," Journal of Alloys and Compounds 585, 460-464 (2014).

Kao et al., "Localized Surface Plasmon-Enhanced Nitride-Based Light-Emitting Diode with Ag Nanotriangle Array by Nanospher Lithography", IEEE Photonics Technology Letters, vol. 22, No. 13, Jul. 1, 2010, 3 page.

LED EMITTERS WITH INTEGRATED NANO-PHOTONIC STRUCTURES TO ENHANCE EQE

CROSS REFERENCE TO RELATED APPLICATIONS

This application is a continuation of U.S. patent application Ser. No. 16/160,738 filed Oct. 15, 2018, which claims the benefit of priority of U.S. Provisional Application Nos. 62/683,410 filed Jun. 11, 2018, and 62/573,383 filed Oct. 17, 2017, and European Patent Application No. 18158917.7 filed Feb. 27, 2018, each of which are incorporated by reference herein in their entirety.

FIELD OF INVENTION

The present invention is directed to light emitting diode (LED) emitters, and more particularly, to LED emitters with integrated nano-photonic structures to enhance external quantum efficiency (EQE).

BACKGROUND

Internal quantum efficiency (IQE) in multiple quantum well (MQW) light emitting diodes (LEDs) is limited by droop related mechanisms. Thus, at high current densities and high temperatures, the pump IQE is one of the main limiting factors to high luminous efficacies. Additionally, the energy radiated by the active region is often trapped in the form of surface waves and eventually dissipated due to ohmic losses. Both of these mechanisms lead to lower EQE. Therefore, a need exists for enhanced LED emitters that address these problems and provides integrated solutions for LED emitter cavities.

SUMMARY

A device, system and method for producing enhanced external quantum efficiency (EQE) LED emission are disclosed. The device, system and method include a patterned layer configured to transform surface modes into directional radiation, a semiconductor layer formed as a III/V direct bandgap semiconductor to produce radiation, and a metal back reflector layer configured to reflect incident radiation. The patterned layer may be one-dimensional, two-dimensional or three-dimensional. The patterned layer may be submerged within the semiconductor layer. The semiconductor layer is p-type gallium nitride (GaN). The patterned layer may be a hyperbolic metamaterials (HMM) layer and may include Photonic Hypercrystal (PhHc), or may be a low or high refractive index material, or arrays of metallic nano-antennas/scatterers, arrays of dielectric nano-antennas/scatterers, arrays of metallo-dielectric scatterers, metallic or dielectric grating structures.

The device, system and method may include an indium tin oxide (ITO) layer positioned between the semiconductor layer and the metal back reflector layer to reduce field confinement improving the kinetic energy of the carriers near the metal reflector while still offering high Purcell factors (PF) and electrical conduction.

The device, system and method may include a low refractive index layer positioned adjacent to the metal back reflector layer to operate in combination with the metal layer to reduce ohmic losses compromising field confinement near the lossy layers to couple the radiation into radiated emissions. The patterned layer may be embedded within the low refractive index layer.

BRIEF DESCRIPTION OF THE DRAWINGS

A more detailed understanding can be had from the following description, given by way of example in conjunction with the accompanying drawings wherein.

DETAILED DESCRIPTION

Figure 1:
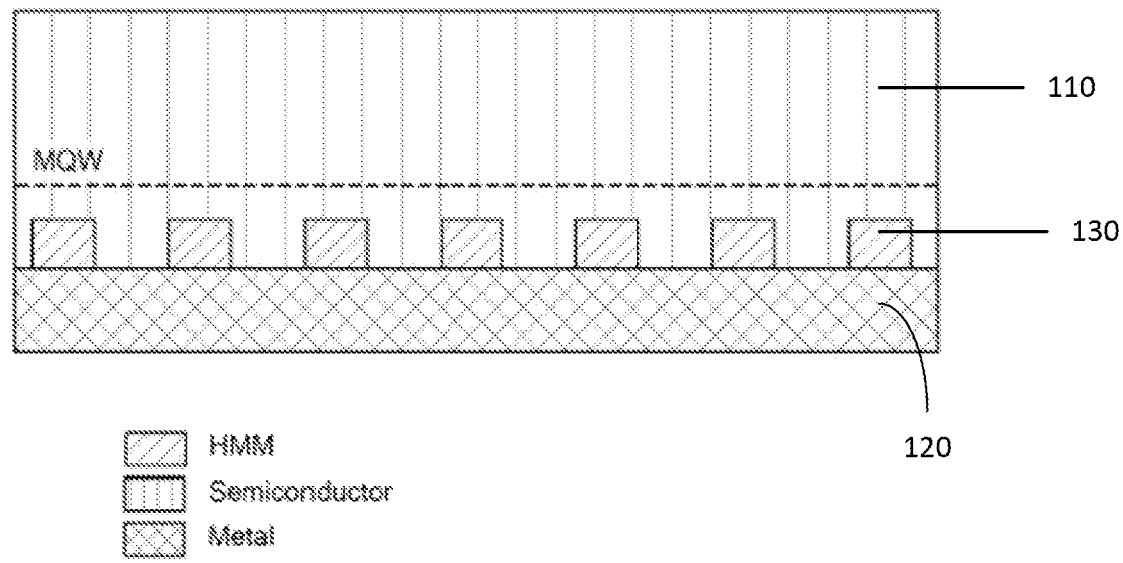
FIG. 1 illustrates a light emitting diode (LED) cavity with a patterned p-type gallium nitride (pGaN) layer embedding a layer of hyperbolic metamaterials (HMM) and a metal back reflector.

In the following description, numerous specific details are set forth, such as particular structures, components, materials, dimensions, processing steps, and techniques, in order to provide a thorough understanding of the present embodiments. However, it will be appreciated by one of ordinary skill of the art that the embodiments may be practiced without these specific details. In other instances, well-known structures or processing steps have not been described in detail in order to avoid obscuring the embodiments. It will be understood that when an element such as a layer, region, or substrate is referred to as being "on" or "over" another element, it can be directly on the other element or intervening elements may also be present. In contrast, when an element is referred to as being "directly on" or "directly"

over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments in the following detailed description, some structures, components, materials, dimensions, processing steps, and techniques that are known in the art may have been combined together for presentation and for illustration purposes and in some instances may have not been described in detail. In other instances, some structures, components, materials, dimensions, processing steps, and techniques that are known in the art may not be described at all. It should be understood that the following description is rather focused on the distinctive features or elements of various embodiments described herein.

Internal quantum efficiency (IQE) in multiple quantum well (MQW) light emitting diodes (LEDs) is limited by droop related mechanisms. Droop occurs when the electrical-to-optical power conversion efficiency drops dramatically with higher input current. Thus, at high current densities and high temperatures, the pump IQE is one of the main limiting factors to high luminous efficacies. The LED emitter with integrated nano-photonic structures to enhance external quantum efficiency (EQE) addresses this issue by coupling near field radiation from the MQW into modes carrying high momentum that are supported by plasmonic structures and/or hyperbolic metamaterials (HMM). While these structures and/or metamaterials may result in high Purcell Factors (PF), the energy radiated by the active region may be trapped in the form of surface waves and eventually dissipated due to ohmic losses. The LED emitter with integrated nano-photonic structures designed to enhance external quantum efficiency (EQE) further addresses this issue by coupling the surface waves into emissions while providing integrated solutions for LED emitter cavities.

FIG. 1 illustrates a light emitting diode (LED) 100 cavity with a patterned p-type gallium nitride (pGaN) layer 110 embedding a layer of hyperbolic metamaterials (HMM) 130 and a metal back reflector 120. The patterned pGaN layer 110 is illustrated as the semiconductor layer 110 in FIG. 1. The pGaN layer 110 may have a thickness of approximately 100 nm. The HMM layer 130 is depicted as the squares shown in a layer embedded within the semiconductor layer 110. The metal back reflector 120 may be adjacent to the HMM layer 130 distal to the semiconductor layer 110. As may be seen in FIG. 1, the metal back reflector 120 may also be adjacent to the semiconductor layer 110 in the regions where no HMM layer 130 exits or in configurations where the HMM layer 130 is spaced apart from the metal back reflector 120 (i.e., the HMM layer 130 is completely embedded within the semiconductor layer 110). The HMM layer 130 may be patterned as a one-dimensional pattern, such as strips into the figure, for example, a two-dimensional pattern, such as a checkboard pattern, for example, and a three-dimensional pattern, such as a pattern incorporating a pattern on another pattern (i.e., a stacked pattern), for example.

The semiconductor layer 110, or cavity, may take the form of a layer of pGaN. As would be understood by those possessing an ordinary skill the pertinent arts, GaN is a binary III/V direct bandgap semiconductor commonly used in light-emitting diodes. GaN has a crystal structure with a wide band gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN as is used in the present example.

The HMM layer 130 may be an embedded patterned metamaterial. While the patterns are described above, the metamaterial may be a Photonic Hypercrystal (PhHc) and additional information on such metamaterials such as one found in Galfsky, PNAS 1702683114. The metamaterial structure features hyperbolic behavior that supports high order modes (i.e., surface states of high momentum) that increase the photonic density of states locally. These surface states of high momentum offers decay channels for dipole emission that enhance radiated emission (i.e., IQE increase via Purcell effect). The Purcell effect is the enhancement of a fluorescent molecule's spontaneous emission rate by its environment.

The near field of the dipole emission is coupled into the surface states and then outcoupled in the form of radiation by the action of the lateral periodic lattice. The lateral periodic lattice transforms the initially induced surface waves into radiation. As the surface waves are transformed into radiation, the radiation becomes highly directional. This directionality may improve light extraction from the semiconductor layer as well as enhance brightness. The HMM layer 130 may be formed in a number of different ways, for instance, by alternating metal/dielectric layers of subwavelength thickness. Other methods of creating HMM layer 130 may be found in an article entitled Photonic Hypercrystals by Evgenii E. Narimanov (Phys. Rev X 4, 041014 (2014)). The presence of the HMM layer 130 creates surface modes that can be transformed into directional radiation as described. The HMM layer 130 may be arranged adjacent to the metal layer 120 within the semiconductor layer 110.

The metal back reflector 120 may take the form of a plasmonic layer including planar metal mirrors, a distributed Bragg reflector (DBR) and/or other known LED reflectors including photonic crystals and reflective metasurfaces.

Figure 2:
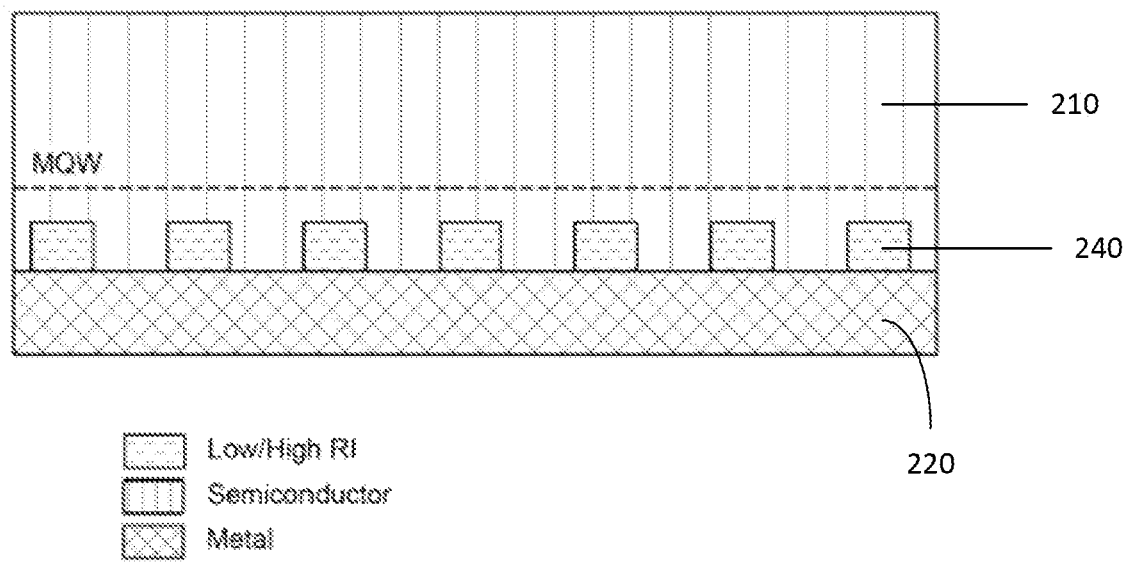
FIG. 2 illustrates a LED cavity with patterned pGaN layer embedding a low or high index (isotropic) material and a metal back reflector.

FIG. 2 illustrates a LED cavity 200 with patterned pGaN layer 210 embedding a low or high index (isotropic) material 240 and a metal back reflector 220. The LED cavity 200 of FIG. 2 includes a semiconductor layer 210, such as the semiconductor layer 110 described above with respect to FIG. 1, and a metal back reflector layer 220, such as the metal back reflector layer 120 described above with respect to FIG. 1. Instead of the HMM layer 130 in FIG. 1, the LED cavity 200 of FIG. 2 includes a layer 240 of low or high refractive index material. This layer 240 of low or high refractive index may be patterned as described above with respect to the HMM layer 130 of FIG. 1. The low or high refractive layer 240, in conjunction with the metal back reflector layer 220, may combine to accomplish the decay rate enhancement. The Bragg grating integrated in the pGaN layer 210 may transform the surface wave into useful radiation. The Bragg grating may be realized with low index materials such as SiO2 to offer high contrast to the semiconductor.

Figure 3:
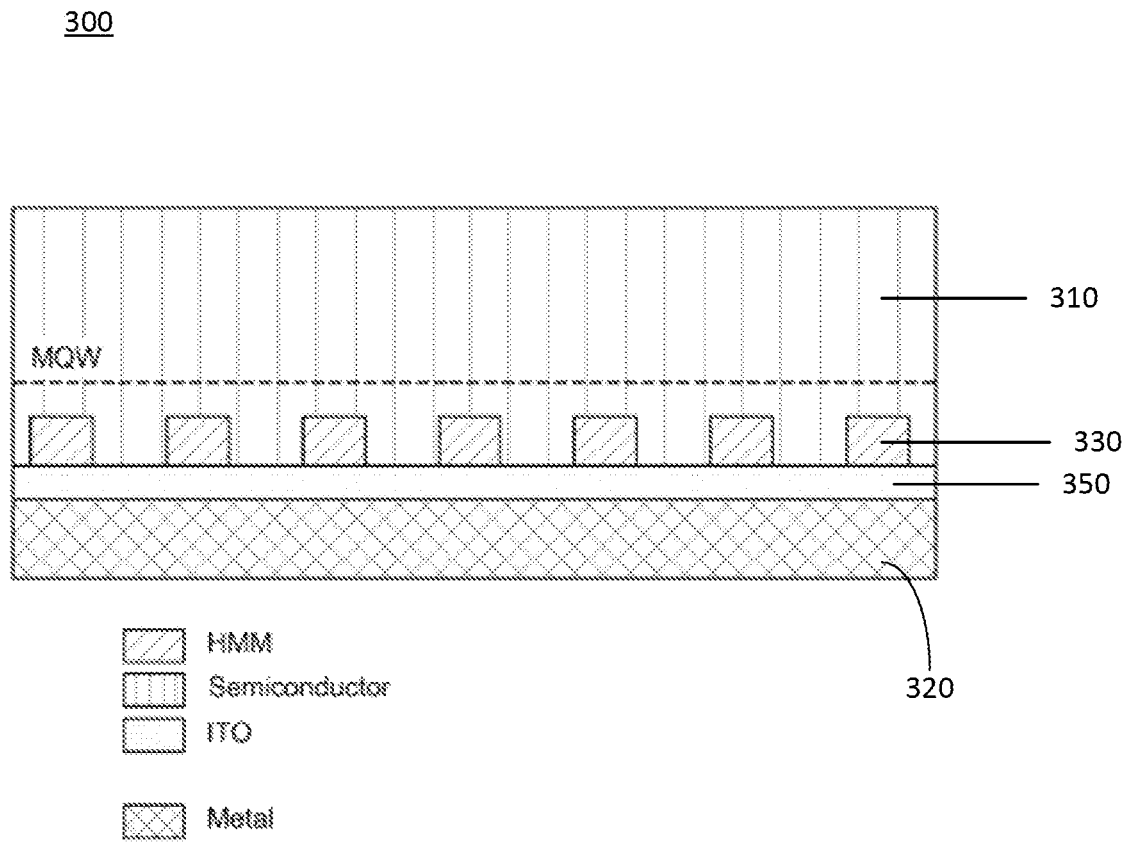
FIG. 3 illustrates a LED cavity with patterned pGaN layer embedding a HMM and a composite indium tin oxide (ITO) layer with a metal back reflector.

FIG. 3 illustrates a LED cavity 300 with patterned pGaN layer 310 embedding a HMM layer 330 and a composite indium tin oxide (ITO) layer 350 with a metal back reflector 320. The LED cavity 300 of FIG. 3 adds to the example in FIG. 1 by including an ITO layer 350. The ITO layer 350 may be located as described below. The LED cavity 300 of FIG. 3 includes a semiconductor layer 310, such as the semiconductor layer 110 described above with respect to FIG. 1, a metal back reflector layer 320, such as the metal back reflector layer 120 described above with respect to FIG. 1, and an HMM layer 330, such as the HMM layer 130 described above with respect to FIG. 1.

In addition, the LED cavity 300 of FIG. 3 includes an ITO layer 350 that is illustrated as being between the HMM layer 330 and the metal back reflector layer 320. The ITO layer 350 may be used based on its electrical conductivity and optical transparency. This ITO layer 350 may reduce field confinement by improving the kinetic energy of the carriers near the metal reflector layer 320 while still offering high PF and electrical conduction. The ITO layer 350 while referred to as ITO may also be formed as an indium zinc oxide (IZO) layer, such as with IZO/Al/GZO/ZnO, for example.

Figure 4:
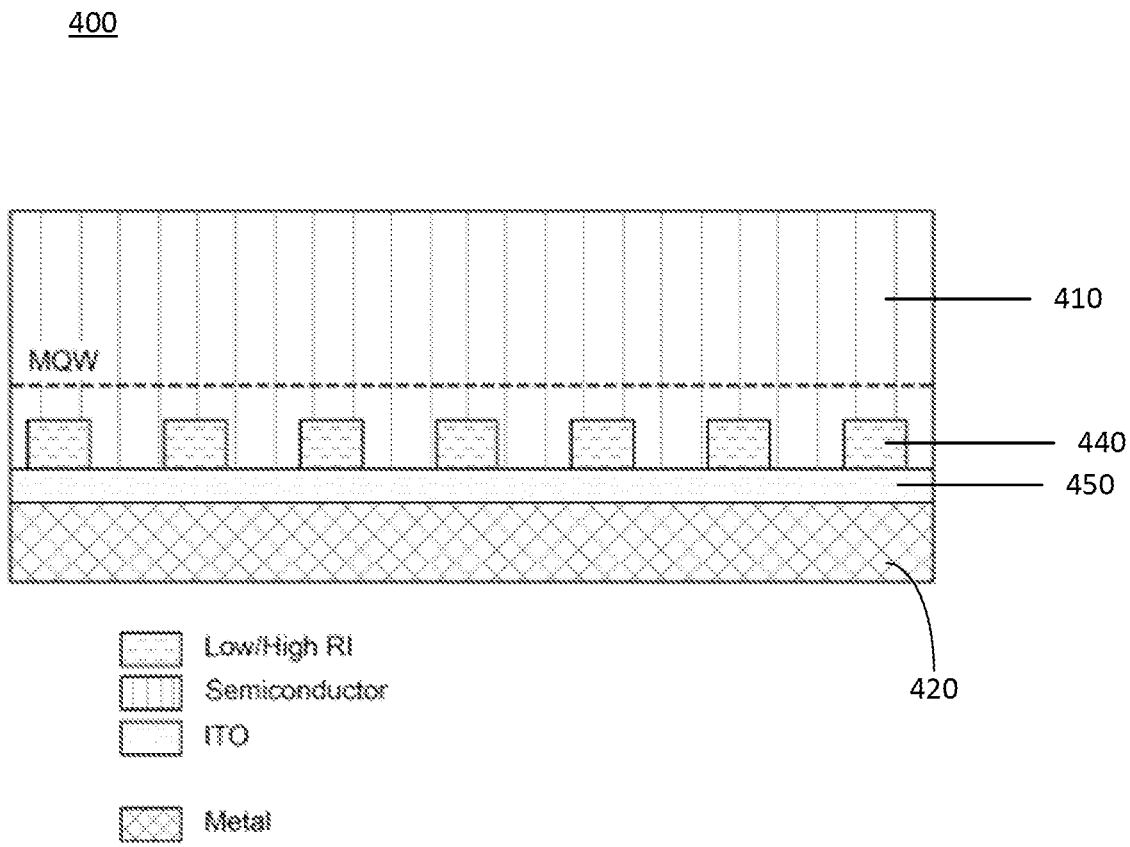
FIG. 4 illustrates a LED cavity with patterned pGaN layer embedding a low or high index (isotropic) material and a composite ITO with a metal back reflector.

FIG. 4 illustrates a LED cavity 400 with patterned pGaN layer 410 embedding a low or high index (isotropic) material 440 and a composite ITO layer 450 with a metal back reflector 420. The LED cavity 400 of FIG. 4 adds to the example in FIG. 2 by including an ITO layer 450. The LED cavity 400 of FIG. 4 includes a semiconductor layer 410, such as the semiconductor layer 210 described above with respect to FIG. 2, a metal back reflector layer 420, such as the metal back reflector layer 220 described above with respect to FIG. 2, and a low or high index material layer 440, such as the low or high refractive index material layer 240 described above with respect to FIG. 2. Such an ITO layer 450 may reduce ohmic losses in the metal back reflector as well as improving the effectiveness of the patterned layer, such as low or high refractive index material layer 440. For example in the case of a nano-antenna array, the included ITO layer 450 may affect the resonance behavior of each individual nano-antenna.

In addition, the LED cavity 400 of FIG. 4 includes an ITO layer 450 that is illustrated as being between the low or high refractive index material layer 440 and the metal back reflector layer 420. The ITO layer 450 may be similar to the ITO layer 350 described above with respect to FIG. 3.

Figure 5:
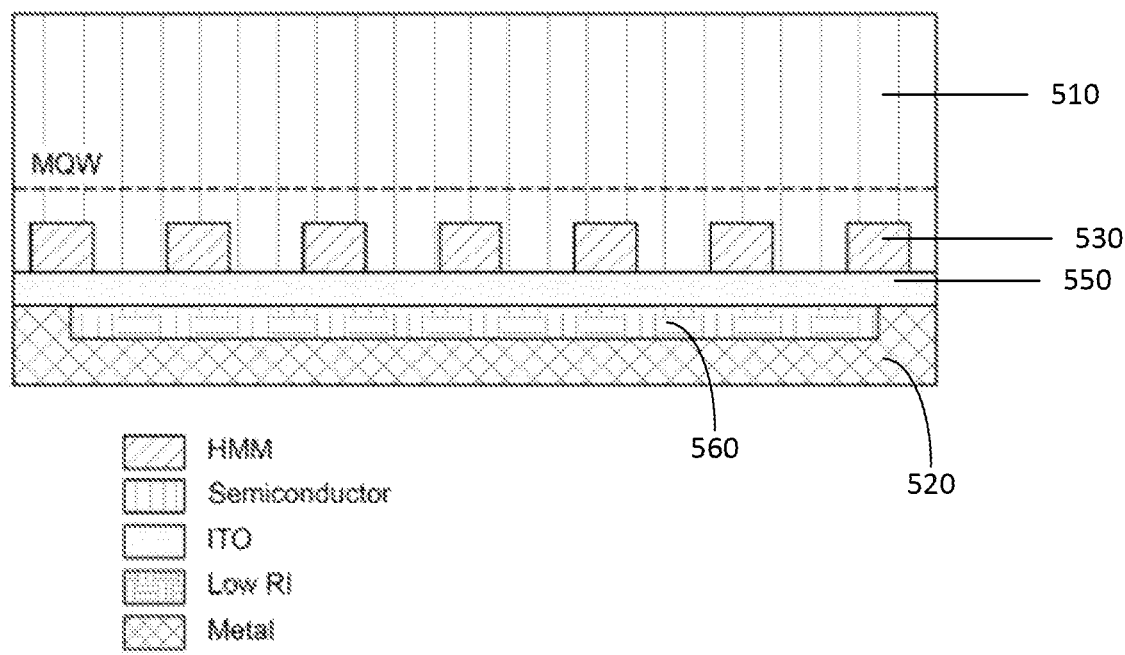
FIG. 5 illustrates a LED cavity with patterned pGaN layer embedding a HMM layer and a composite dielectric layer with an ITO layer and a metal back reflector.

FIG. 5 illustrates a LED cavity 500 with patterned pGaN layer 510 embedding a HMM layer 530 and a composite dielectric layer 560 with an ITO layer 550 and a metal back reflector 520. The LED cavity 500 of FIG. 5 adds to the example in FIG. 3 by including a low refractive index layer 560 between the ITO layer 550 and the metal layer 520. The LED cavity 500 of FIG. 5 includes a semiconductor layer 510, such as the semiconductor layer 110 described with respect to FIG. 1, an ITO layer 550, such as the ITO layer 350 described above with respect to FIG. 3, a metal back reflector layer 520, such as the metal back reflector layer 120 described above with respect to FIG. 1, and an HMM layer 530, such as the HMM layer 130 described above with respect to FIG. 1. This ITO layer 550 allows for lateral current spreading into the electrical vias. The distance separating such electrical vias is much larger than the separation of the photonic features. For example the nano-antennas are separated by a few or several tens of nanometers and the electrical vias may be separated by tenths of micrometers.

The low refractive index layer 560 in combination with the metal layer 520 may form composite mirror architecture to reduce ohmic losses compromising field confinement near the lossy layers by aiding to couple the radiation into radiated emissions.

Figure 6:
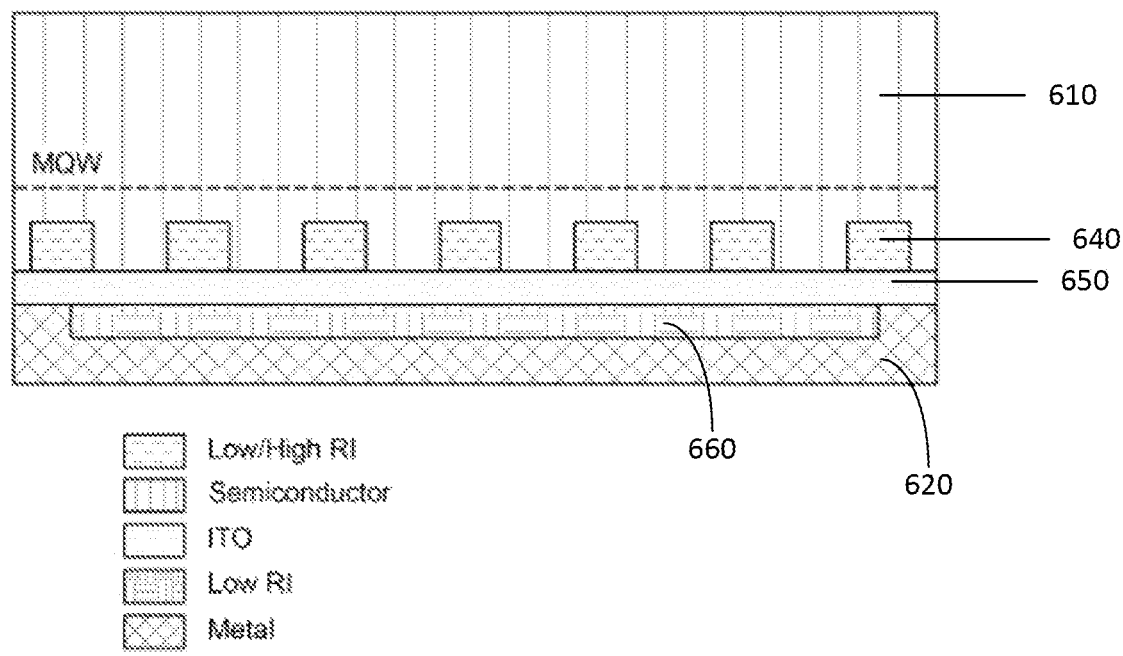
FIG. 6 illustrates a LED cavity with patterned pGaN layer embedding a low or high index (isotropic) material and a composite dielectric layer with a ITO layer and a metal back reflector.

FIG. 6 illustrates a LED cavity 600 with patterned pGaN layer 610 embedding a low or high index (isotropic) material layer 640 and a composite dielectric layer 660 with an ITO layer 650 and a metal back reflector 620. The LED cavity 600 of FIG. 6 adds to the example in FIG. 4 by including a low refractive index layer 660, such as the low refractive index layers 560 described above with respect to FIG. 5, between the ITO layer 650 and the metal layer 620. This low refractive index layer 660 may function as the low refractive index layer 560 of FIG. 5. The LED cavity 600 of FIG. 6 includes a semiconductor layer 610, such as the semiconductor layer 210 described above with respect to FIG. 2, a metal back reflector layer 620, such as the metal back reflector layer 220 described above with respect to FIG. 2, and a low or high index material layer 640, such as the low or high refractive index material layer 240 described above with respect to FIG. 2.

Figure 7:
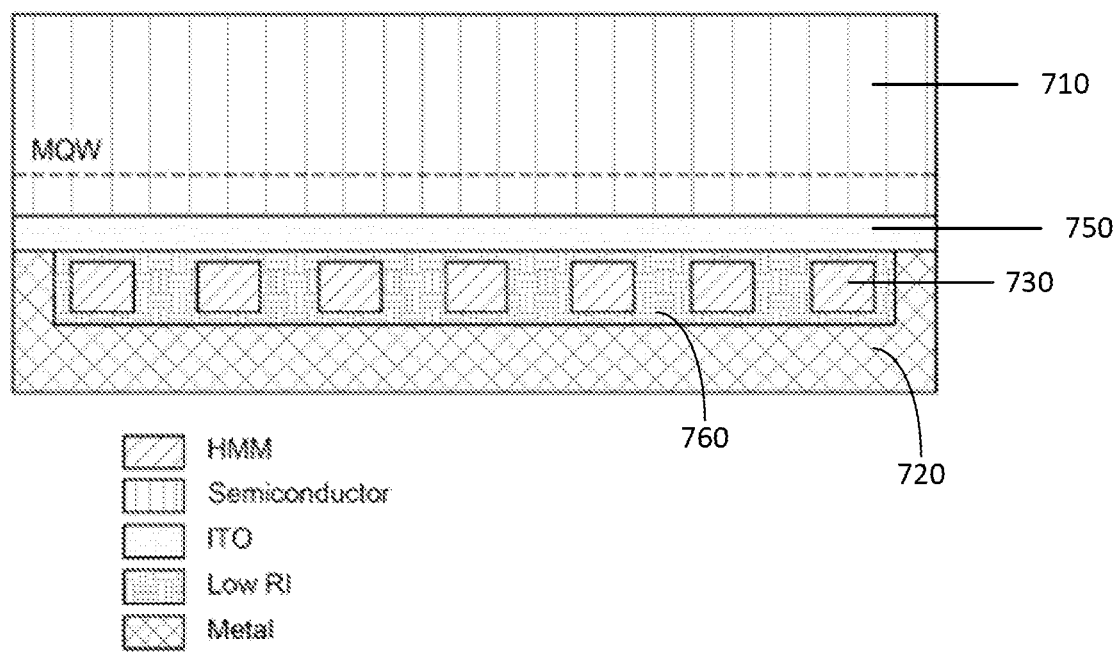
FIG. 7 illustrates a LED cavity with a composite dielectric layer, an ITO layer and a metal back reflector wherein the dielectric layer embeds a patterned HMM layer.

FIG. 7 illustrates a LED cavity 700 with a composite dielectric layer 760, an ITO layer 750 and a metal back reflector layer 720 wherein the dielectric layer 760 embeds a patterned HMM layer 730. The LED cavity 700 of FIG. 7 adds to the example in FIG. 5 by including the patterned HMM layer 730 embedded within the low refractive index (dielectric) layer 760 as opposed to the example of FIG. 5 where the HMM layer 530 is embedded within the semiconductor layer 510 as described above or in the ITO layers 550. The HMM layer 730 embedded within the low refractive index layer 760 may simplify the implementation of the LED cavity 700 at the cost of compromising optical performance. The LED cavity 700 of FIG. 7 includes a semiconductor layer 710, such as the semiconductor layer 110 described above with respect to FIG. 1, an ITO layer 750, such as the ITO layer 350 described above with respect to FIG. 3, a low refractive index layer 760 between the ITO layer and the metal layer, such as the low refractive index layer 560 of FIG. 5, a metal back reflector layer 720, such as the metal back reflector layer 120 described above with respect to FIG. 1, and an HMM layer 730, such as the HMM layer 130 described above with respect to FIG. 1.

Figure 8:
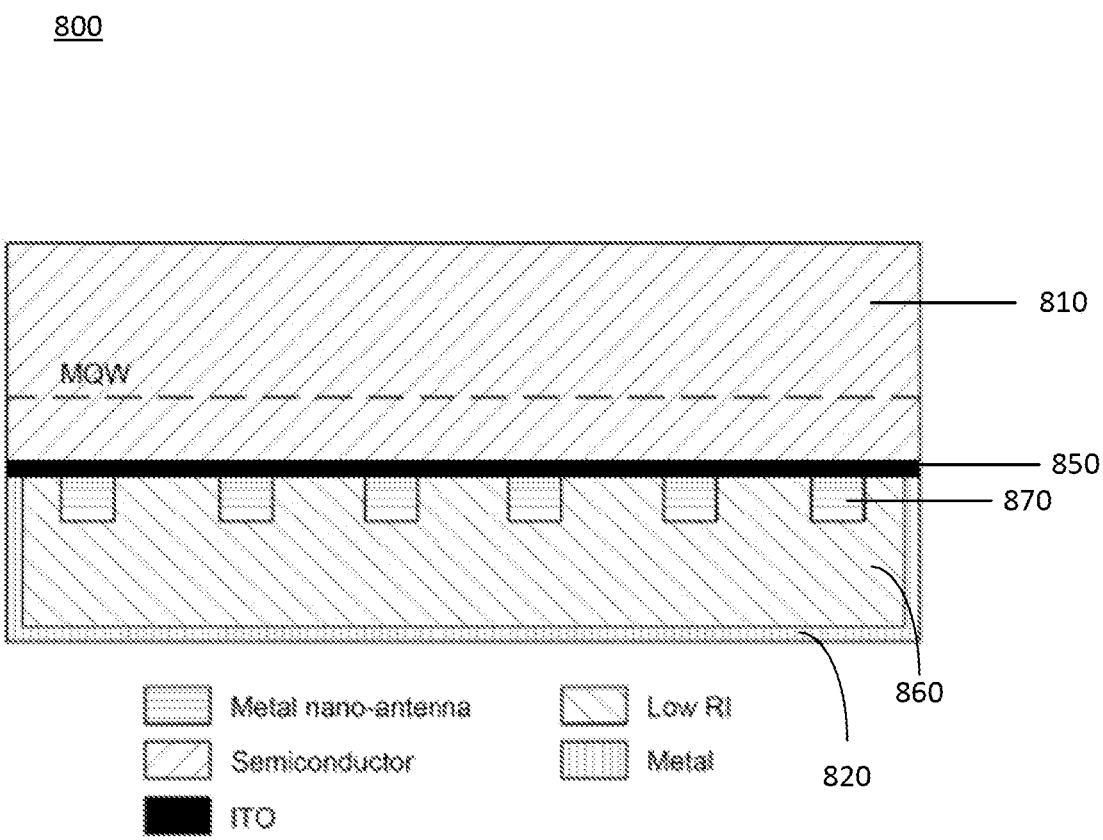
FIG. 8 illustrates a LED cavity with a composite dielectric layer, an ITO layer and a metal back reflector wherein the dielectric layer embeds a metal nano-antenna located near to the surface of the ITO layer.

FIG. 8 illustrates a LED cavity 800 with a composite dielectric layer 860, an ITO layer 850 and a metal back reflector layer 820 wherein the dielectric layer 860 embeds a metal nano-antenna array 870 located near to the surface of the ITO layer 850. The ITO layer 850 may be a thin AZO layer for the same purpose. The placement of the metal nano-antenna array 870 near to the surface of the ITO layer 850 places the metal nano-antenna layer 870 as proximate to the active region of the semiconductor layer 810 as possible while still keeping it within the dielectric layer 860. The metal nano-antenna array 870 may produce a strong amplification of the radiative decay rates as compared to other materials surrounding the nano-antenna. As would be understood by those possessing an ordinary skill in the pertinent arts, the metallic nano-particles within array 870 generally have high optical absorption, which may compromise light extraction efficiency. The choice between metal and dielectric may be made on the trade-off between IQE and ExE in the application for the LED. For example, applications requiring high current density operation may be governed by low IQE associated to the intrinsic droop. In such an application, increasing IQE at the cost of ExE may result into net flux gains.

Figure 9:
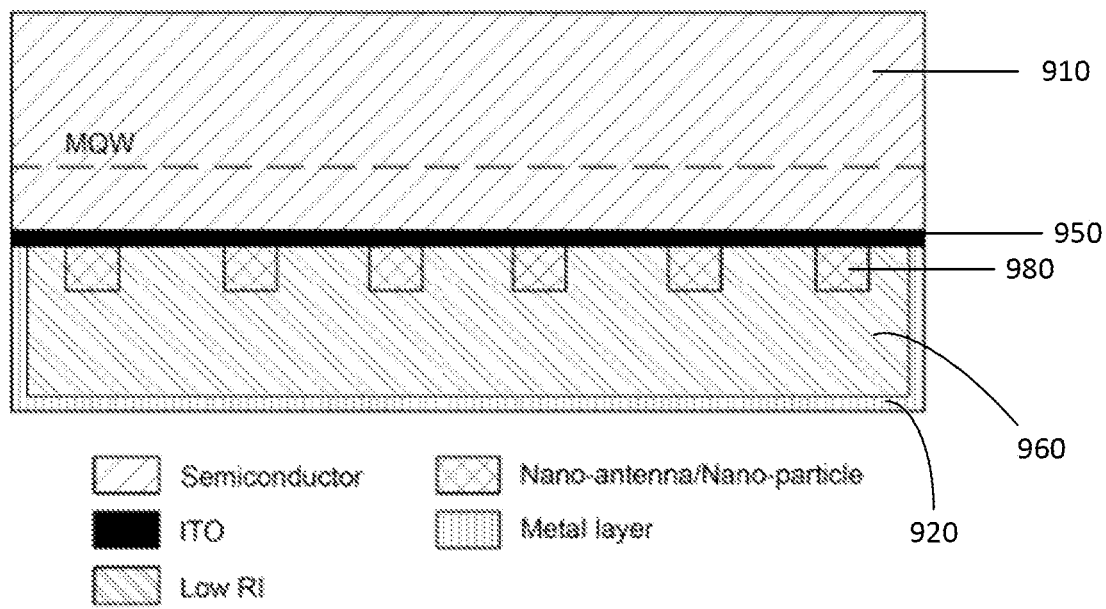
FIG. 9 illustrates a LED cavity with a composite dielectric layer, an ITO layer and a metal back reflector wherein the dielectric layer embeds a dielectric nano-antenna array near to the surface of the ITO layer.

FIG. 9 illustrates a LED cavity 900 with a composite dielectric layer 960, an ITO layer 950 and a metal back reflector layer 920 wherein the dielectric layer 960 embeds a dielectric nano-antenna array 980 near to the surface of the ITO layer 950. FIG. 9 represents a similar structure to that in FIG. 8 using a dielectric nano-antenna 980 in place of the metal nano-structure 870 in FIG. 8. Again, the ITO layer 950 may be a thin AZO layer for the same purpose. The placement of the dielectric nano-antenna array 980 near to the surface of the ITO layer 950 places the dielectric nano-antenna array 980 as proximate to the active region of the semiconductor layer 910 as possible while still keeping it within the dielectric layer 960. In such a configuration the radiation may be shaped so that in addition to increasing the Purcell factor, the radiation pattern emitted by the quantum well is modified to modify the radiation pattern of the overall structure. The choice between metal and dielectric may be made on the trade-off between IQE and ExE in the application for the LED. In addition, the trade-off may include a compromise between the overall radiation pattern and EXE. For example, applications requiring high current density operation may be governed by low IQE associated to the intrinsic droop. In such an application, increasing IQE at the cost of ExE may result into net flux gains.

Figure 10:
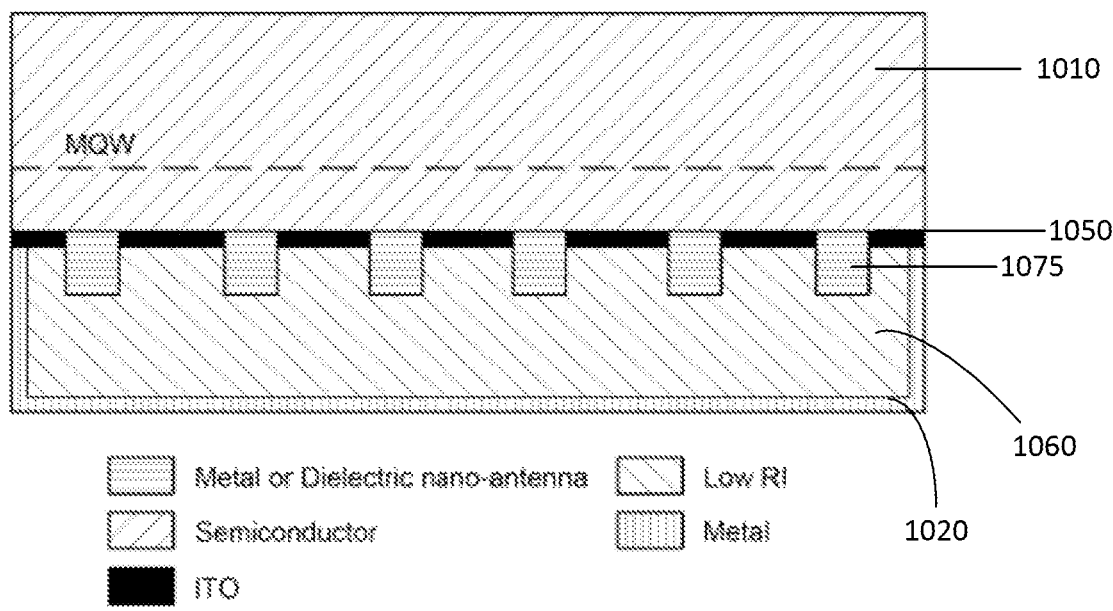
FIG. 10 illustrates a LED cavity with a composite dielectric layer, an ITO layer and a metal back reflector wherein the dielectric layer embeds a dielectric or metallic nano-antenna array at the surface of the ITO layer.

FIG. 10 illustrates a LED cavity 1000 with a composite dielectric layer 1060, an ITO layer 1050 and a metal back reflector layer 1020 wherein the dielectric layer 1060 embeds a dielectric or metallic nano-antenna array 1075 at the surface of the ITO layer 1050. The ITO layer 1050, which may alternatively be an AZO layer, is partially etched away at the location of the nano-antenna array 1075 so that the nano-particles of the nano-antenna array 1075 are proximate, or in contact with, the surface of the semiconductor layer 1010 (the surface of the pGaN layer 1010). This allows the nano-antenna array 1075 to be as close as possible to the MQW active region of the semiconductor layer 1010. This configuration may enhance the intended effect of maximizing PF without patterning the semiconductor pGaN layer 1010.

Figure 11:
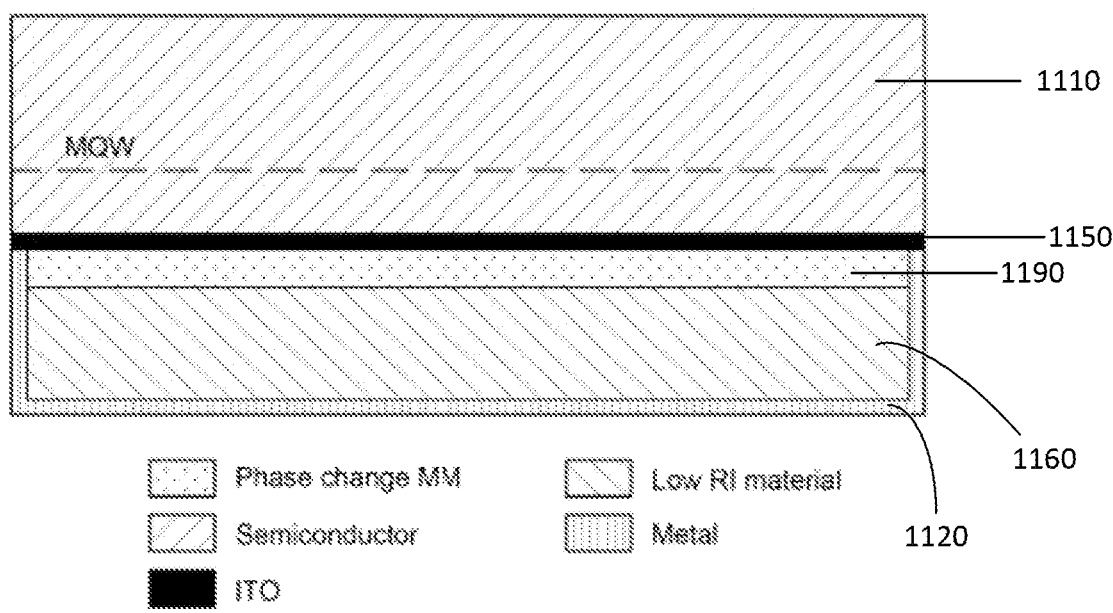
FIG. 11 illustrates a LED cavity with a composite dielectric layer, an ITO layer and a metal back reflector wherein the dielectric layer embeds a phase-change HMM interfacing with ITO layer.

FIG. 11 illustrates a LED cavity 1100 with a composite dielectric layer 1160, an ITO layer 1150 and a metal back reflector layer 1120 wherein the dielectric layer 1160 embeds a phase-change HMM layer 1190 interfacing with ITO layer 1150. Again, the ITO layer 1150 may be a thin AZO layer for the same purpose. A phase-change HMM layer 1190 may be located proximate to the interface between the dielectric layer 1160 and the ITO layer 1150 in place of the periodic nano-antenna array layer 1075 described herein above. The phase change HMM layer 1190 may include a gradient impedance plasmonic or dielectric metasurface. The phase change HMM layer 1190 may allow the control over the phase of the reflected fields for tailoring the standing wave field patterns between mirror and MQWs. With proper tuning of the interference pattern, the PF may be increased and the angular radiation of the MQW emission modified to maximize light extraction efficiency.

Figure 12:
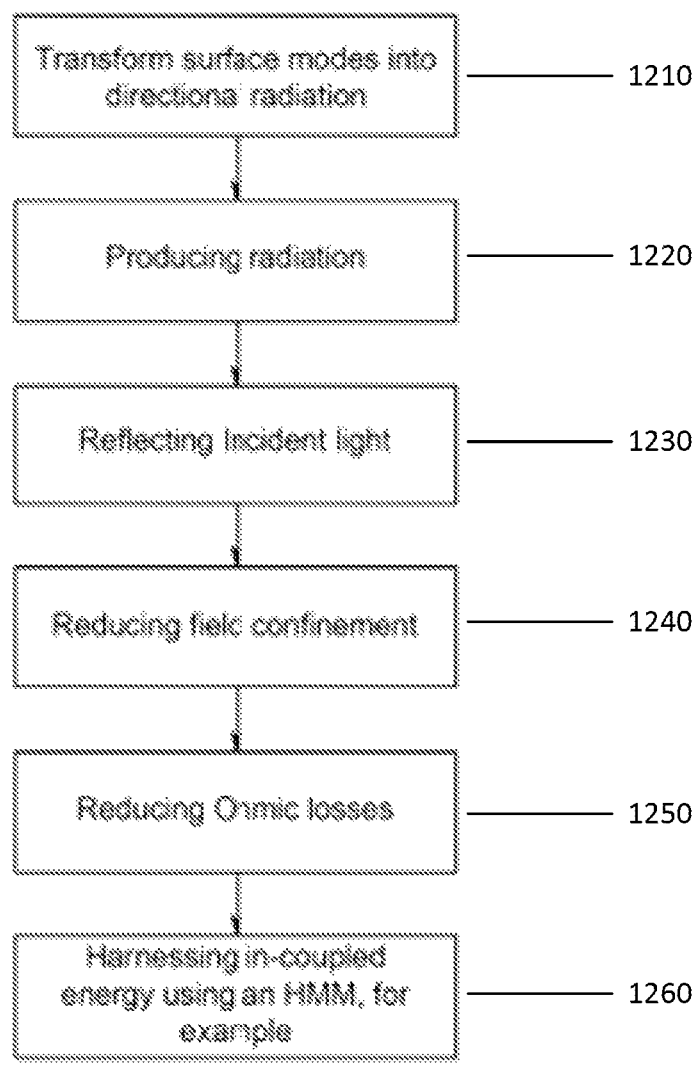
FIG. 12 illustrates a method for producing enhanced external quantum efficiency (EQE) LED emission.

FIG. 12 illustrates a method 1200 for producing enhanced external quantum efficiency (EQE) LED emission. The method 1200 transforms surface modes into directional radiation via a patterned layer at step 1210. The patterned layer may be one-dimensional, two-dimensional or three-dimensional. The patterned layer may be a hyperbolic meta-materials (HMM) layer and may include Photonic Hyper-crystal (PhHc), or may be a low or high refractive index material, or may be a metal. The method 1200 includes producing radiation in a semiconductor layer at step 1220. The semiconductor layer is p-type gallium nitride (GaN). The method 1200 includes reflecting incident light at a metal back reflector at step 1230. The placement of the patterned layer may be within the semiconductor layer, or within the dielectric layer, for example.

The method 1200 may also include reducing field confinement at step 1240 while improving the kinetic energy of the carriers near the metal reflector while still offering high PF and electrical conduction in an ITO layer positioned between the semiconductor layer and the metal back reflector layer.

The method 1200 may also include reducing ohmic losses at step 1250 compromising field confinement near the lossy layers to couple the radiation into radiated emissions using a low refractive index layer positioned adjacent to the metal back reflector layer to operating in combination with the metal layer.

The method 1200 may also include positioning the patterned structures near the multiple quantum wells to couple evanescent waves from the LED into surface modes or other modes exciting the structures. This enhances the in-coupling of energy produced by the source at step 1260. The HMM layer may harness this in-coupled energy.

The present device, system and method increases IQE via PF enhancements in droop limited emitter solutions, reduces optical losses in plasmonic and HMM structures for LED solutions, increases ExE in LED cavities, and improves directional emission.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A device comprising:
   a light emitting semiconductor layer comprising multiple quantum wells;
   a nano-photonic structure disposed below the light emitting semiconductor layer and arranged to couple near field radiation from the multiple quantum wells into surface electronic states of the nano-photonic structure; and
   a lattice structure disposed between the nano-photonic structure and the multiple quantum wells and arranged to out-couple radiation from the surface electronic states of the nano-photonic structure.

2. The device of claim 1, wherein the lattice structure is not in direct contact with the nano-photonic structure.

3. The device of claim 1, wherein the lattice structure is embedded in a dielectric material.

4. The device of claim 1, wherein the lattice structure is in direct contact with the light emitting semiconductor layer.

5. The device of claim 1, wherein the lattice structure is not in direct contact with the light emitting semiconductor layer.

6. The device of claim 5, further comprising a transparent conductive layer between the lattice structure and the light emitting semiconductor layer.

7. The device of claim 1, wherein the lattice structure is a metal nano-antenna array.

8. The device of claim 1, wherein the lattice structure is a dielectric nano-antenna array.

9. The device of claim 1, wherein the nano-photonic structure is not in direct contact with the light emitting semiconductor layer.

10. The device of claim 1, wherein the nano-photonic structure is a photonic crystal.

11. The device of claim 1, further comprising a transparent conductive layer between the lattice structure and the nano-photonic structure.

12. The device of claim 1, wherein the nano-photonic structure consists of dielectric material.

13. The device of claim 1, wherein the nano-photonic structure is a plasmonic layer consisting of metal.

14. The device of claim 1, wherein the lattice structure is an array and the transparent conductive layer is etched at locations of the array to permit the array to directly contact the light emitting semiconductor structure.

15. A device comprising:
- a light emitting semiconductor layer comprising multiple quantum wells;
- a transparent conductive layer and a dielectric layer below the light emitting semiconductor layer;
- a nano-photonic structure disposed below the transparent conductive layer and arranged to couple near field radiation from the multiple quantum wells into surface electronic states of the nano-photonic structure; and
- a lattice structure disposed between the dielectric material and the light emitting semiconductor layer and arranged to out-couple radiation from the surface electronic states of the nano-photonic structure to form light output, the lattice structure in direct contact with the dielectric material and the light emitting semiconductor layer without being in direct contact with the nano-photonic structure.

\* \* \* \* \*